(12) United States Patent
Mercer et al.

(10) Patent No.: US 7,541,275 B2
(45) Date of Patent: Jun. 2, 2009

(54) METHOD FOR MANUFACTURING AN INTERCONNECT

(75) Inventors: Betty Shu Mercer, Plano, TX (US); Erika Leigh Shoemaker, Richardson, TX (US); Byron Lovell Williams, Plano, TX (US); Laurinda W. Ng, Plano, TX (US); Alec J. Morton, Plano, TX (US); C. Matthew Thompson, Highland Village, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/828,592

(22) Filed: Apr. 21, 2004

(65) Prior Publication Data

US 2005/0239277 A1 Oct. 27, 2005

(51) Int. Cl.
*H01L 21/44* (2006.01)

(52) U.S. Cl. ............... 438/614; 257/737; 257/E23.02; 257/E21.477

(58) Field of Classification Search ............. 438/713, 438/614; 257/737, E23.02, E21.477
See application file for complete search history.

(56) References Cited

U.S. PATENT DOCUMENTS

| | | | | |
|---|---|---|---|---|
| 2,908,557 A * | 10/1959 | Black et al. | ............. | 216/93 |
| 4,258,382 A * | 3/1981 | Harris | ............. | 257/737 |
| 4,849,124 A * | 7/1989 | Backus | ............. | 252/79.4 |
| 4,927,505 A * | 5/1990 | Sharma et al. | ............. | 205/123 |
| 5,108,542 A * | 4/1992 | Lin | ............. | 438/720 |
| 5,108,950 A * | 4/1992 | Wakabayashi et al. | ............. | 438/614 |
| 5,293,071 A * | 3/1994 | Erdos | ............. | 257/737 |
| 5,316,974 A * | 5/1994 | Crank | ............. | 438/643 |
| 5,376,584 A * | 12/1994 | Agarwala | ............. | 438/614 |
| 5,418,186 A * | 5/1995 | Park et al. | ............. | 438/614 |
| 5,503,286 A * | 4/1996 | Nye et al. | ............. | 216/13 |
| 5,620,611 A * | 4/1997 | Datta et al. | ............. | 216/13 |
| 5,656,858 A * | 8/1997 | Kondo et al. | ............. | 257/737 |
| 5,700,389 A * | 12/1997 | Nakagawa | ............. | 252/79.2 |
| 5,814,238 A * | 9/1998 | Ashby et al. | ............. | 216/62 |
| 5,838,067 A * | 11/1998 | Baek | ............. | 257/737 |
| 5,937,320 A * | 8/1999 | Andricacos et al. | ............. | 438/614 |
| 6,025,275 A * | 2/2000 | Efland et al. | ............. | 438/722 |
| 6,293,457 B1 * | 9/2001 | Srivastava et al. | ............. | 228/254 |
| 6,436,300 B2 * | 8/2002 | Woolsey et al. | ............. | 216/13 |
| 6,544,878 B2 * | 4/2003 | Wang | ............. | 438/612 |
| 6,569,752 B1 * | 5/2003 | Homma et al. | ............. | 438/597 |

(Continued)

OTHER PUBLICATIONS

S. Wolf, "Silicon Processing for the VLSI Era," 1986, vol. 1, pp. 520-523 & 551-555.*

*Primary Examiner*—Douglas M Menz
*Assistant Examiner*—Steven J Fulk
(74) *Attorney, Agent, or Firm*—Wade J. Brady III; Frederick J. Telecky, Jr.

(57) ABSTRACT

The present invention provides an interconnect for use in an integrated circuit, a method for manufacturing the interconnect, and a method for manufacturing an integrated circuit including the interconnect. The interconnect (100), among other elements, includes a surface conductive lead (160) located in an opening formed within a protective overcoat (110), and a barrier layer (140) located between the protective overcoat (110) and the surface conductive lead (160), a portion of the barrier layer (140) forming a skirt (145) that extends outside a footprint of the surface conductive lead (160).

15 Claims, 5 Drawing Sheets

U.S. PATENT DOCUMENTS

| | | | |
|---|---|---|---|
| 6,583,039 B2 * | 6/2003 | Chen et al. | 438/612 |
| 6,664,128 B2 * | 12/2003 | Tong et al. | 438/106 |
| 6,750,133 B2 * | 6/2004 | Datta | 438/613 |
| 6,878,633 B2 * | 4/2005 | Raskin et al. | 438/694 |
| 2002/0072215 A1 * | 6/2002 | Furuya | 438/613 |
| 2002/0121692 A1 * | 9/2002 | Lee et al. | 257/737 |
| 2003/0129822 A1 * | 7/2003 | Lee et al. | 438/613 |
| 2003/0157792 A1 * | 8/2003 | Tong et al. | 438/614 |
| 2004/0005771 A1 * | 1/2004 | Fan et al. | 438/613 |
| 2005/0073048 A1 * | 4/2005 | Bojkov et al. | 257/737 |

* cited by examiner

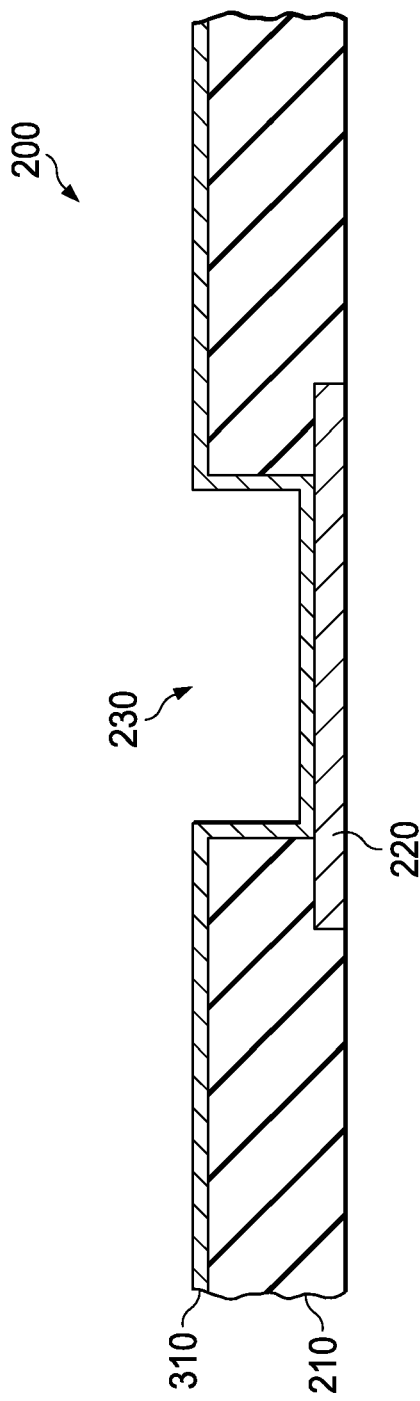
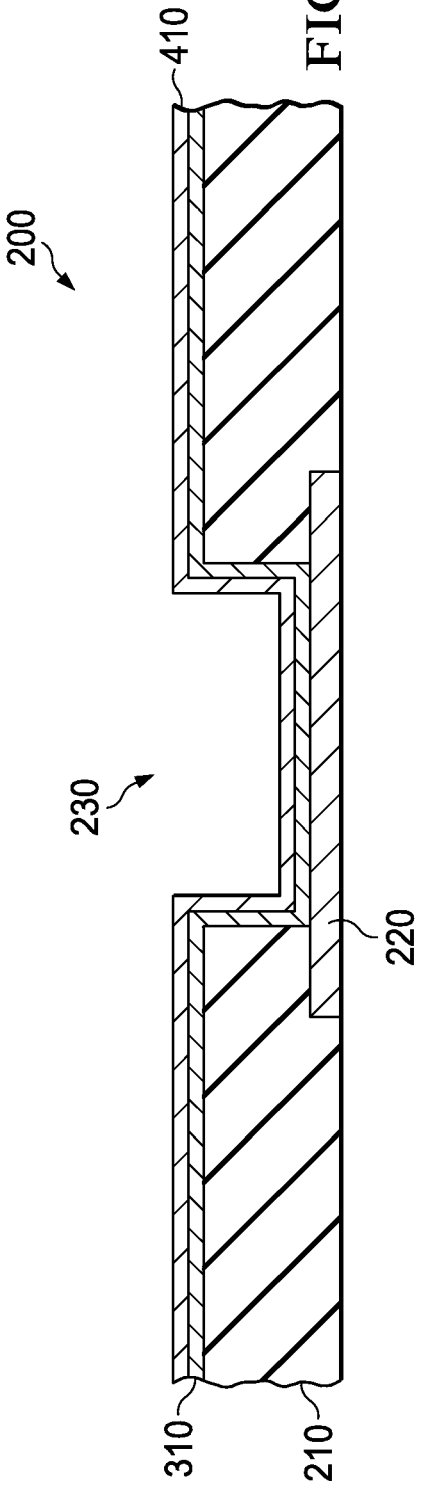

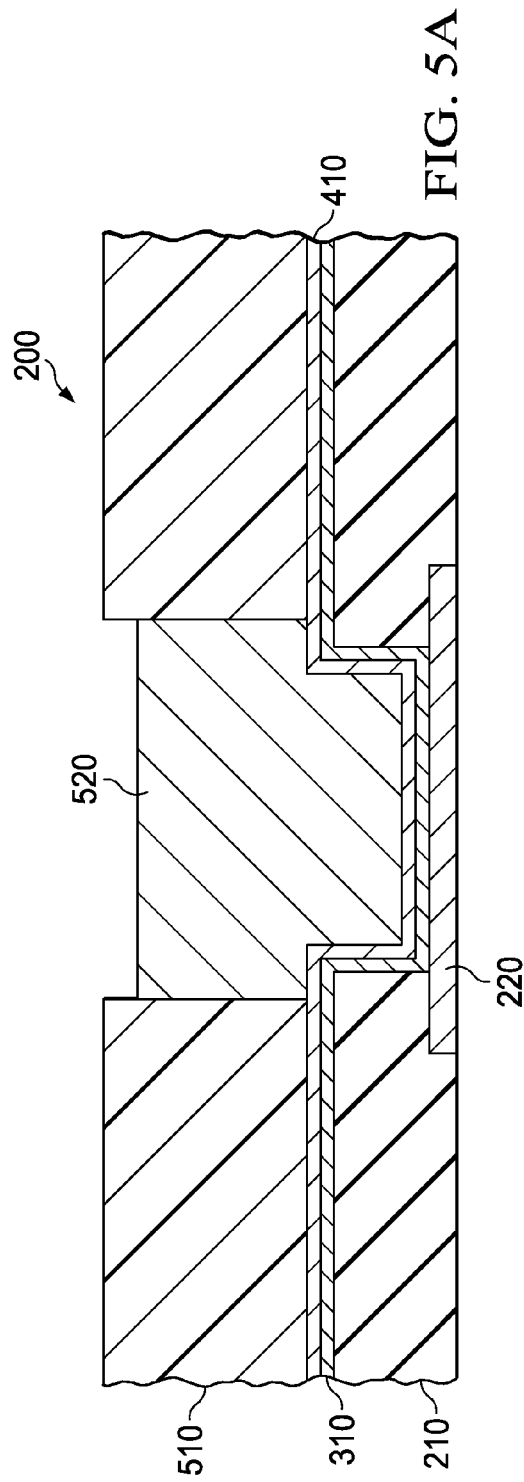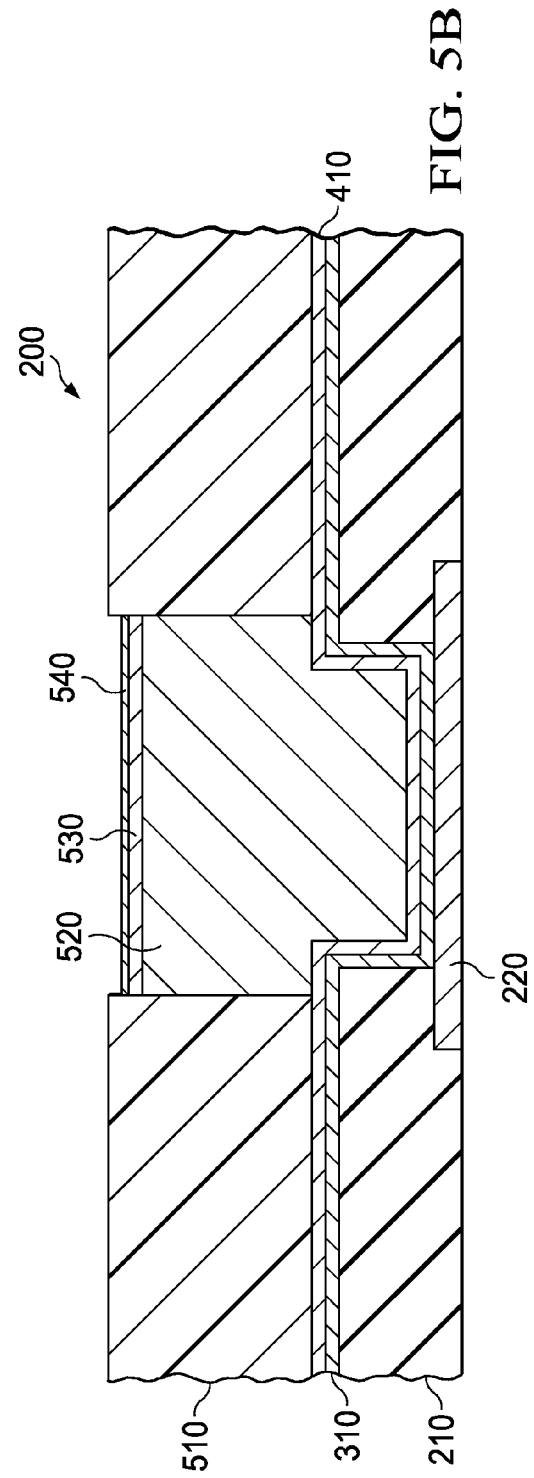

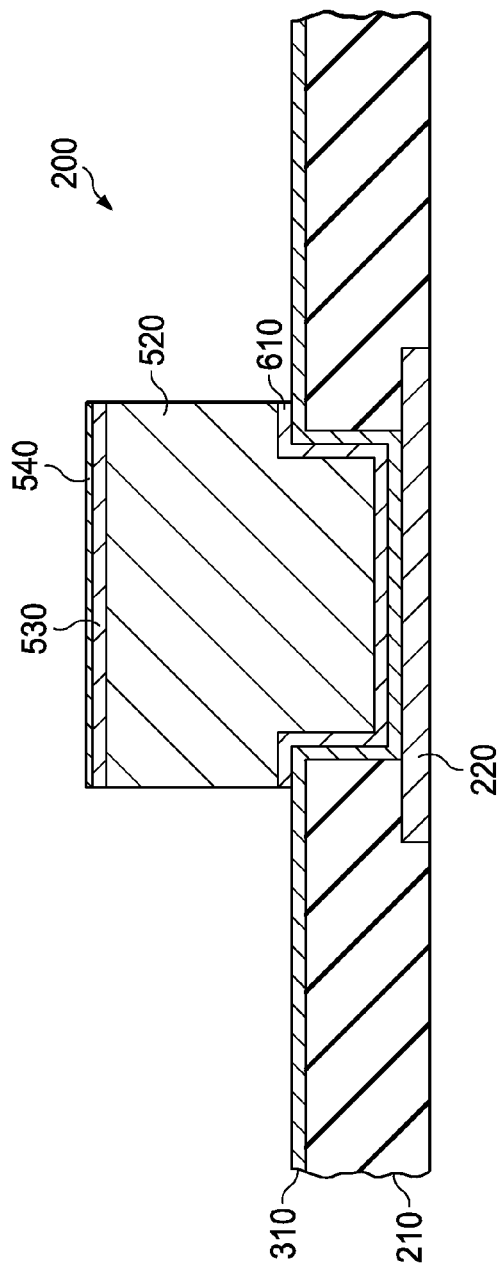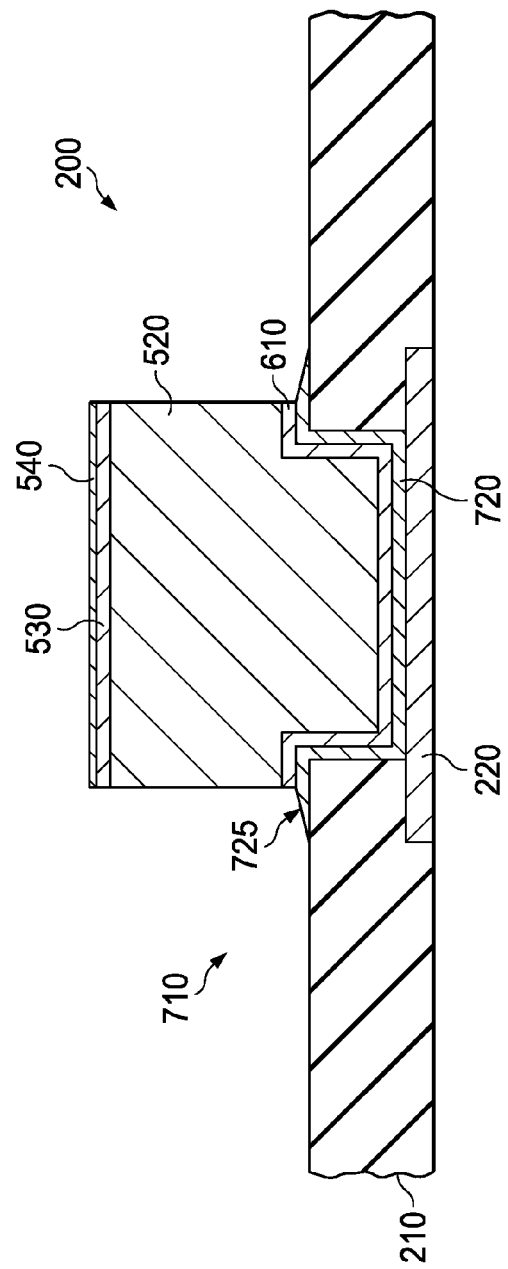

METHOD FOR MANUFACTURING AN INTERCONNECT

TECHNICAL FIELD OF THE INVENTION

The present invention is directed, in general, to an interconnect and, more specifically, to an interconnect including a surface conductive lead, a method of manufacture therefor, and a method for manufacturing an integrated circuit including the surface conductive lead.

BACKGROUND OF THE INVENTION

For integrated circuit power devices that experience high currents, e.g., currents above about 100 milliamps, thick copper is desirable for forming low resistance leads. Where the currents are above about 1 amp, and especially when the currents are above about 10 amps, thick copper can be considered essential. Thick copper allows the higher currents to be carried in a considerably smaller area than would be required with other metal layers. Thick copper is formed over a protective overcoat. The protective overcoat provides physical, chemical, and ion protection for underlying structures.

According to a standard process for forming thick copper leads, the protective overcoat is lithographically patterned to expose the bond pads. The bond pads are typically about 60 μm to about 100 μm square. A conductive barrier layer and a copper seed layer are sputter deposited over the protective overcoat and within the openings patterned through the overcoat. A resist coating is then formed and patterned to cover the copper seed layer everywhere except where thick copper is desired. Thick copper is then plated on the surface. After plating, the resist is removed and exposed portions of the barrier layer and seed layer are etched away using a wet etchant. This process is generally effective, but the resulting products in some cases may show undesirable failure rates, especially in next generation devices.

Accordingly, what is needed in the art is an improved interconnect lead and a method of manufacture therefor.

SUMMARY OF THE INVENTION

To address the above-discussed deficiencies of the prior art, the present invention provides an interconnect for use in an integrated circuit, a method for manufacturing the interconnect, and a method for manufacturing an integrated circuit including the interconnect. The interconnect for use in the integrated circuit, among other elements, includes a surface conductive lead located in an opening formed within a protective overcoat, and a barrier layer located between the protective overcoat and the surface conductive lead, a portion of the barrier layer forming a skirt that extends outside a footprint of the surface conductive lead.

The method for manufacturing the interconnect, among other steps, includes forming a surface conductive lead in an opening formed within a protective overcoat and over a barrier layer, a portion of the barrier layer extending beyond the surface conductive lead, and subjecting the portion of the barrier layer to a dry etch to remove the portion, the dry etch selective to the barrier layer.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which:

FIG. 3 illustrates a cross-sectional view of the partially completed interconnect system illustrated in FIG. 2 after forming a barrier layer over the protective overcoat and within the opening;

FIG. 4 illustrates a cross-sectional view of the partially completed interconnect system illustrated in FIG. 3 after forming a seed layer over the barrier layer and within the opening;

FIG. 5A illustrates a cross-sectional view of the partially completed interconnect system illustrated in FIG. 4 after patterning a thick resist layer over the protective overcoat and forming a surface conductive lead within the opening patterned in the resist layer;

FIG. 5B illustrates a cross-sectional view of an alternative embodiment of the partially completed interconnect system illustrated in FIG. 5A after forming optional protective layers over the top surface of the surface conductive lead;

FIG. 6 illustrates a cross-sectional view of the partially completed interconnect system illustrated in FIG. 5B after removing the thick resist layer and etching the exposed portions of the seed layer to form an etched seed layer;

FIG. 7 illustrates a cross-sectional view of the partially completed interconnect system illustrated in FIG. 6 after etching portions of the barrier layer extending beyond the surface conductive lead to form a completed interconnect system.

DETAILED DESCRIPTION

Interconnects, and more specifically, thick copper surface conductive leads, are well known and commonly used in today's high technology fields. Unfortunately, as recognized by the present invention, as the width of the thick copper surface conductive leads decrease with the use of next generation devices, undercut that exists at the barrier layer/surface conductive lead interface is much more detrimental. The undercut currently effectively reduces the width of the conductive lead at its base by an amount ranging from about 14% to about 30%. While this does not presently cause too many problems, as the desired width of the conductive leads continues to decrease, the undercut could conceivably reduce the width from about 35% to about 70%, or even more if the width of the conductive leads continued to decrease. It is believed that the next generation devices would experience reliability issues due to this extreme undercut.

One inventive aspect of the present invention is the recognition that the etch chemistries used to etch the barrier layer and copper seed layer located under the conductive leads are at least partially responsible for the undercut. It has further been recognized that the wet etch used to etch the barrier layer actually undercuts the copper seed layer at the barrier layer/conductive lead interface. Given those recognitions and substantial experimentation, the present invention identified that the wet etch used to etch the barrier layer could be substituted with a dry etch. Uniquely, the barrier layer dry etch does not cause the substantial undercut caused by the barrier layer wet etch. Therefore, in one aspect, the present invention recognizes that a dry etch may be used to etch the barrier layer associated with a conductive lead, to provide a copper lead that does not have the undesirable undercut existing in the prior art devices.

An additional recognition is the fact that the wet etch also causes undesirable width reduction in the interconnect lead, as well as undesirable oxide formation on the sidewalls of the interconnect lead and the top of the interconnect lead if a protective layer is not used. The dry etch, used in accordance with the principles of the present invention, also substantially eliminates these two undesirable effects.

Figure 1:
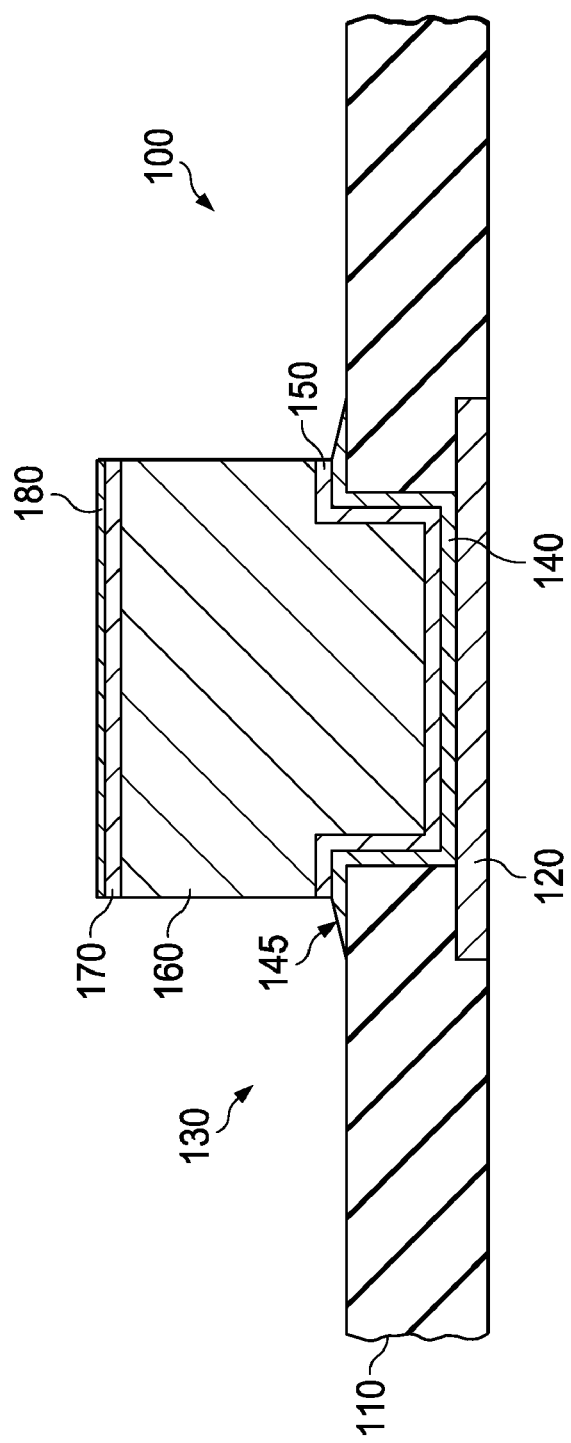
FIG. 1 illustrates a cross-sectional view of one embodiment of an interconnect system manufactured in accordance with the principles of the present invention.

Turning now to FIG. 1, illustrated is a cross-sectional view of one embodiment of an interconnect system 100 manufactured in accordance with the principles of the present invention. The interconnect system 100 of FIG. 1 initially includes a protective overcoat 110 located over a conductive layer 120. The protective overcoat 110 is often referred to as a passivation layer, and provides electrical isolation and mechanical protection for underlying structures, such as the conductive layer 120. Preferably, the protective overcoat 110 also provides chemical and ion protection.

As may be appreciated, the conductive layer 120 may form all or only a portion of a metallization layer. In the embodiment of FIG. 1, the conductive layer 120 forms a portion of an upper most metallization layer. The conductive layer 120 may comprise one or more different conductive materials, such as aluminum, copper, tungsten, etc.

Located within an opening in the protective overcoat 110 and contacting the conductive layer 120 is an interconnect 130. The interconnect 130, in an exemplary embodiment of the present invention, provides electrical signals from a source located outside of the protective coating 110 to devices protected by the protective coating 110.

The interconnect 130 illustrated in FIG. 1 includes a barrier layer 140 located within the opening and contacting the conductive layer 120. The barrier layer 140, as illustrated, includes a skirt 145 that extends outside a footprint of the surface conductive lead 160. As will be appreciated, the skirt 145 may extend from about 250 nm to about 2000 nm outside of the footprint, and may taper down as it moves away from the surface conductive lead 160. The skirt 145, as will be detailed below, is a result of the unique process used to manufacture the interconnect 130. The skirt 145, however, does provide certain benefits. For example, the skirt 145 provides additional adhesion between the protective overcoat 110 and the surface conductive lead 160, particularly if an undercut of the seed layer 150 were to occur.

Located over the barrier layer 140 and at least partially within the opening in the protective overcoat 110 may be a seed layer 150. As those skilled in the art appreciate, the seed layer 150 is used to help electroplate the surface conductive lead 160. In an instance where the surface conductive lead 160 comprises a thick copper surface conductive lead, the seed layer 150 would comprise a copper seed layer.

The surface conductive lead 160, which may comprise copper or another similar material, may have a number of different widths and thicknesses. Nevertheless, a thickness ranging from about 3 µm to about 25 µm (and commonly from about 6 µm to about 15 µm) and a minimum width comparable to the thickness, are advantageous. Optionally located over the surface conductive lead 160 may be protective layers 170, 180. The protective layer 170 may be a 3000 nm nickel layer and the protective layer 180 may be a 300 nm palladium layer. Other thicknesses and types of materials could comprise the protective layers 170, 180. For example, gold may be used in place of or in conjunction with the palladium layer. It should also be noted that the protective layers 170, 180, not only provide protection, however, those layers also provide an exemplary and robust means of forming the electrical connections, such as wire bonds, to the surface conductive lead 160.

Figure 2:
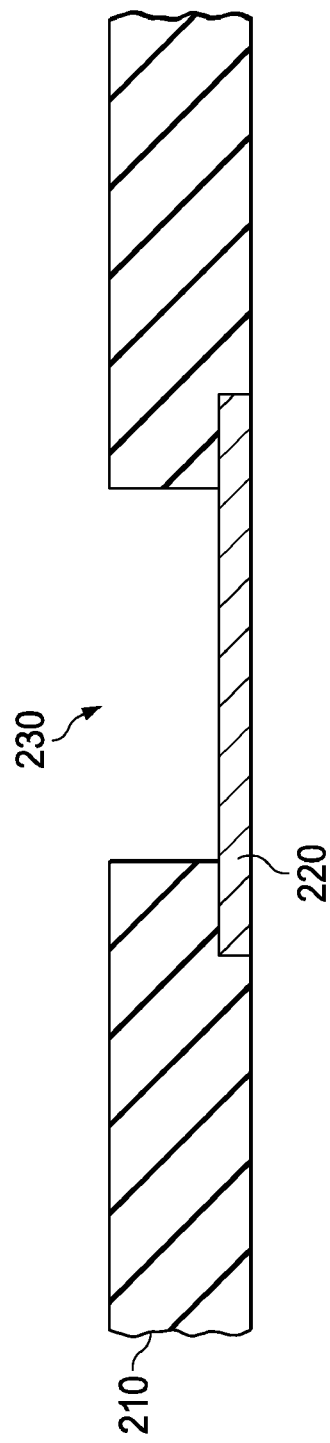
FIG. 2 illustrates a cross-sectional view of a partially completed interconnect system.

Turning now to FIGS. 2-7, illustrated are cross-sectional views of detailed manufacturing steps instructing how one might, in an advantageous embodiment, manufacture an interconnect system similar to the interconnect system 100 depicted in FIG. 1. FIG. 2 illustrates a cross-sectional view of a partially completed interconnect system 200. The partially completed interconnect system 200 of FIG. 2 includes a protective overcoat 210 located over a conductive layer 220. The protective overcoat 210 may comprise one or more layers. Typical layer materials include silicon nitride, silicon oxynitride, silicon oxide, PSG (Phospho-Silicate Glass), organic polymers (e.g., a polyimide), and other materials. Silicon nitride is preferred for its strength, but silicon oxynitride is often used in its place where transparency is needed, for example, to allow UV memory erase. Preferably the overall thickness of the protective overcoat 210 is from about 500 nm to about 2000 nm, more preferable from about 800 nm to about 1500 nm.

The conductive layer 220, as indicated earlier, may be any conductive material located within an integrated circuit. The conductive layer 220 of the present invention, however, is an upper most metallization layer of the integrated circuit. The conductive material 220 may comprise a number of different materials while staying within the scope of the present invention, including aluminum as it is shown in FIG. 2.

An exemplary lithographic process has been used to form an opening 230 in the protective overcoat 210, the opening 230 being located over the conductive material 220. Lithography refers to a process for pattern transfer between various media. The lithographic process may include forming a radiation sensitive resist coating over the layer to be patterned, in this case the protective overcoat 210. The radiation sensitive resist coating may then be patterned by selectively exposing the resist through a mask. In turn, the exposed areas of the coating become either more or less soluble than the unexposed areas, depending on the type of resist. A solvent developer may then be used to remove the less soluble areas leaving the patterned resist. After the resist is patterned, the protective overcoat 210 may be etched using the patterned resist as a mask to transfer the pattern to the protective overcoat 210. Etch processes, among others, might include plasma etching, reactive ion etching, wet etching, or combinations thereof. Nevertheless, plasma etching is preferred. Preferably, the etch process is highly anisotropic and gives vertical sidewalls to the protective overcoat 210. After the opening 230 has been etched in the protective overcoat 210, the remaining resist may be removed, resulting in a device similar to that shown in FIG. 2.

Turning now to FIG. 3, illustrated is a cross-sectional view of the partially completed interconnect system 200 illustrated in FIG. 2 after forming a barrier layer 310 over the protective overcoat 210 and within the opening 230. The barrier layer 310 is formed such that it contacts the conductive layer 220 exposed by the opening 230. The barrier layer 310 is conductive, and in an exemplary embodiment limits diffusion from the layers located thereover. In the instant invention the barrier layer 310 prevents copper diffusion from the layers located thereover. Additional functions of the barrier layer 310 can include providing low electrical resistance between the conductive layer 220 and the subsequently formed surface conductive lead, as well as providing good adhesion between these metals. The barrier layer 310 can be a refractory metal such as titanium, tungsten, chromium, molybdenum, or an alloy thereof. In a preferred embodiment, the barrier layer 310 is tungsten titanium (TiW). The thickness of the barrier layer 310 is preferably from about 100 nm to about 500 nm, more preferably from about 200 nm to about 300 nm.

The barrier layer 310 can be formed by any suitable method including, for example, physical vapor deposition, chemical vapor deposition, electroless plating, electroplating, or sputtering. Generally, chemical or physical vapor deposition may be used to provide uniform coating of the opening 230, especially when the opening 230 has steep sidewalls.

Turning now to FIG. 4, illustrated is a cross-sectional view of the partially completed interconnect system 200 illustrated in FIG. 3 after forming a seed layer 410 over the barrier layer 310 and within the opening 230. The seed layer 410, in the embodiment of FIG. 4, is formed such that it contacts the barrier layer 310. The uppermost portion of the seed layer 410 is generally copper. The copper portion is generally from about 100 nm to about 500 nm thick, more preferably from about 200 nm to about 300 nm thick. The seed layer 410 can be deposited by any suitable means including, for example, sputter deposition, chemical vapor deposition or electroplating. It should be appreciated that seed layer 410 in the present example is illustrated as a single layer, however, multi-layer seed layers (e.g., TiW and copper) may be employed and are contemplated by the present invention.

Turning now to FIG. 5A, illustrated is a cross-sectional view of the partially completed interconnect system 200 illustrated in FIG. 4 after patterning a thick resist layer 510 over the protective overcoat 210 and forming a surface conductive lead 520 within an opening patterned in the resist layer 510. The thick resist layer 510 may be patterned using a similar process as discussed above with respect to FIG. 2. As the thick resist layer 510 will define the shape and thickness of the surface conductive lead 520, the thick resist layer 510 should be deposited to a thickness greater than the desired thickness for surface conductive lead 520. For example, a 25 µm thick resist can be used. The opening patterned within the thick resist layer 510 should range from about 6 µm for narrow leads to several hundreds of µm for wider leads. In next generation devices, however, the width of the opening could be significantly less.

After patterning the thick resist layer 510, the surface conductive lead 520 may be conventionally plated within the opening in the thick resist layer 510 and on the exposed seed layer 410. As one would appreciate, either electrical or electroless plating can be used. The surface conductive lead 520, in an exemplary embodiment, should have a thickness of at least about 5 µm thick, preferable from about 6 µm to about 15 µm thick.

Turning briefly to FIG. 5B, illustrated is a cross-sectional view of an alternative embodiment of the partially completed interconnect system 200 illustrated in FIG. 5A after forming optional protective layers 530, 540 over the top surface of the surface conductive lead 520. The optional protective layers 530, 540, each have their specific use and material composition. For instance, the protective layer 530 in the embodiment of FIG. 5B is a 3000 nm nickel layer and is configured to insure reliable wire bonding or for other assembly purposes. In addition, the protective layer 540 in the embodiment of FIG. 5B is a 300 nm palladium layer configured to protect the surface of the protective layer 530 from unwanted corrosion or oxidation. Similarly, the protective layers 530, 540, provide a surface more acceptable to gold wire bonding. Likewise, the protective layers 530, 540 protect the surface conductive lead 520 from the etchants used to etch the barrier layer 310 and copper seed layer 410.

Turning now to FIG. 6, illustrated is a cross-sectional view of the partially completed interconnect system 200 illustrated in FIG. 5B after removing the thick resist layer 510 and etching the exposed portions of the seed layer 410 to form an etched seed layer 610. As indicated above, those skilled in the art understand the various processes that could be used to remove the thick resist layer 510. The etching of the seed layer 610, however, is a little more unique. In the embodiments of the present invention the seed layer 410 is etched using a wet etch. For instance, a wet etch chemistry including hydrogen peroxide and sulfuric acid has been identified as working extremely well. Other wet etchants are, nonetheless, within the scope of the present invention. Notice how the wet etchant typically used to etch the seed layer 410 does not substantially undercut the etched seed layer 610 or surface conductive lead 520. As the seed layer wet etch is selective to the seed layer 410, it does not substantially affect the barrier layer 310.

Turning now to FIG. 7, illustrated is a cross-sectional view of the partially completed interconnect system 200 illustrated in FIG. 6 after etching portions of the barrier layer 310 extending beyond the surface conductive lead 520 to form a completed interconnect 710. The completed interconnect 710 includes the etched barrier layer 720. Notice again how the etch used to etch the barrier layer 310 does not substantially undercut into the surface conductive lead 520 or etched seed layer 610. Actually, unique to the present invention, the etchant used to form the etched barrier layer 720 often leaves a skirt 725 extending outside a footprint of the surface conductive lead 520. In an exemplary embodiment, the skirt 725 extends from about 250 nm to about 2000 nm outside of the footprint. Additionally, the skirt 725 may taper down as it moves away from the surface conductive lead 520.

The etchant used to etch the barrier layer 310 is a dry etchant. In an exemplary embodiment the dry etchant includes, amongst other gases, carbon tetrafluoride. As indicated, the carbon tetrafluoride may be combined with a number of different gases and stay within the scope of the present invention. As one would appreciate, each gas has its benefits and drawbacks. For instance, when carbon tetrafluoride is combined with nitrous oxide ($N_2O$) substantially no undercutting occurs, no oxide forms on the top surface of the surface conductive lead 520 and thus there is no need to perform an addition step to remove this oxide. Additionally, there would be no need to perform an argon plasma clean process to remove any copper that might have been redeposited during the oxide removal step.

If the carbon tetrafluoride were combined with oxygen, however, substantially no undercutting would occur, but an oxide layer might form on the top or side surfaces of the surface conductive lead 520. This oxide would therefore need to be removed. In most instances, any copper redeposited when removing the oxide would need to be removed using an argon plasma. Unfortunately, there still exists a chance for DC leakage (e.g., between various completed interconnects 710) and excess capacitance, both of which might cause circuit failures. Nevertheless, the carbon tetrafluoride and oxygen dry etch still provides a superior interconnect 710 to one that might be provided using the conventional wet etch of the barrier layer 310. Carbon tetrafluoride could also be combined with chlorine gas. This combination would again provide substantially no undercut. One skilled in the art will understand the benefits and drawbacks associated with using the chlorine gas.

Accordingly, it has been observed that a plasma barrier layer etch using about 75 sccm of carbon tetrafluoride and 10 sccm of oxygen at a pressure of about 50 mtorr and energy of about 2500 watts for about 30 minutes provided a superior etched barrier layer 720. Similarly, it has been observed that a plasma barrier layer etch using about 75 sccm of carbon tetrafluoride and 10 sccm of nitrous oxide at a pressure of about 200 mtorr and energy of about 600 watts for about 10 minutes provided a superior etched barrier layer 720. The gas flow rates, pressures, energies and times previously mentioned could be adjusted and stay within the scope of the present invention.

Figure 8:
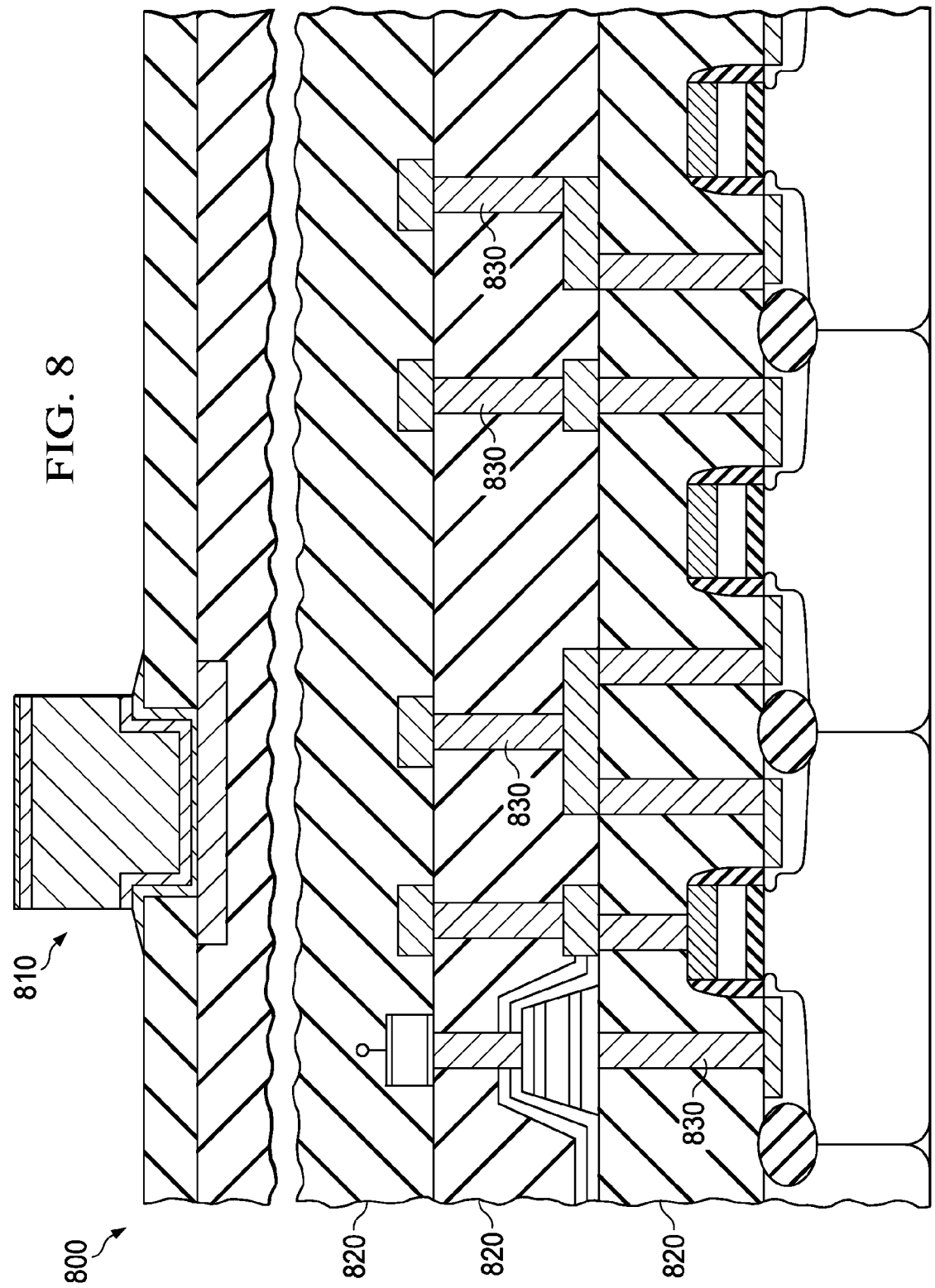
FIG. 8 illustrates an exemplary cross-sectional view of a conventional integrated circuit (IC) incorporating an interconnect system constructed according to the principles of the present invention.

Referring finally to FIG. 8, illustrated is an exemplary cross-sectional view of a conventional integrated circuit (IC) 800 incorporating an interconnect 810 constructed according to the principles of the present invention. The IC 800 may include devices, such as transistors used to form CMOS devices, BiCMOS devices, Bipolar devices, as well as capacitors or other types of devices. The IC 800 may further include passive devices, such as inductors or resistors, or it may also include optical devices or optoelectronic devices. Those skilled in the art are familiar with these various types of devices and their manufacture. In the particular embodiment illustrated in FIG. 8, the IC 800 includes the interconnect 810. The interconnect 810 is located over dielectric layers 820 having conductive vias 830 located therein.

Although the present invention has been described in detail, those skilled in the art should understand that they can make various changes, substitutions and alterations herein without departing from the spirit and scope of the invention in its broadest form.

What is claimed is:

1. A method for manufacturing an interconnect for an integrated circuit, comprising:
    forming a surface conductive lead in an opening formed within a protective overcoat and over a barrier layer, the barrier layer providing additional adhesion between the protective overcoat and the surface conductive lead, a portion of the barrier layer extending beyond the surface conductive lead;
    providing a seed layer directly contacting the barrier layer and at least partially within the opening of the protective overcoat;
    subjecting the seed layer to a wet etch, wherein the wet etch is without substantially undercutting the etched seed layer or surface conductive lead and without substantially affecting the barrier layer;
    subjecting the portion of the barrier layer to a dry etch, subsequent to subjecting the seed layer to a wet etch, to remove the portion and form a skirt, the dry etch selective to the barrier layer without substantially undercutting the etched seed layer or surface conductive lead, without width reduction of the surface conductive lead, and without oxide formation on side walls of the surface conductive lead.

2. The method as recited in claim 1 wherein the dry etch comprises carbon tetrafluoride.

3. The method as recited in claim 2 wherein the dry etch further comprises nitrous oxide.

4. The method as recited in claim 2 wherein the dry etch further comprises oxygen or chlorine.

5. The method as recited in claim 1 wherein the barrier layer is a tungsten titanium barrier layer.

6. The method as recited in claim 1 wherein the barrier layer has a thickness ranging from about 200 nm to about 300 nm.

7. The method as recited in claim 1 wherein the wet etch comprises an etch chemistry comprising hydrogen peroxide and sulfuric acid.

8. The method as recited in claim 1 wherein the surface conductive lead has a width ranging from about 3 µm to about 200 µm.

9. The method as recited in claim 1 wherein the protective overcoat comprises one or more layers selected from the group consisting of silicon oxynitride layers, silicon oxide layers, and silicon nitride layers, phospho-silicate glass layers, and organic polymer layers.

10. The method as recited in claim 1 wherein a thickness of the skirt tapers down as it moves away from the surface conductive lead.

11. A method for manufacturing an integrated circuit, comprising:
    forming transistor devices over a semiconductor substrate;
    forming one or more metallization layers over the transistor devices, the one or more metallization layers interconnecting one or more of the transistor devices;
    forming a protective overcoat over the one or more metallization layers, wherein the protective overcoat has an opening located therein;
    forming a surface conductive lead in the opening and over a barrier layer, the barrier layer providing additional adhesion between the protective overcoat and the surface conductive lead, a portion of the barrier layer extending beyond the surface conductive lead;
    providing a seed layer directly contacting the barrier layer and at least partially within the opening of the barrier layer;
    subjecting the seed layer to a wet etch, wherein the wet etch is without substantially undercutting the etched seed layer or surface conductive lead and without substantially affecting the barrier layer; and
    subjecting the portion of the barrier layer to a dry etch, subsequent to subjecting the seed layer to the wet etch, to remove the portion thereby forming a skirt, the dry etch selective to the barrier layer without substantially undercutting the etched seed layer or surface conductive lead, without a width reduction of the surface conductive lead, and without oxide formation on side walls of the surface conductive lead.

12. The method as recited in claim 11 wherein the wet etch comprises an etch chemistry comprising hydrogen peroxide and sulfuric acid.

13. The method as recited in claim 11 wherein the surface conductive lead has a width ranging from about 3 µm to about 200 µm.

14. The method as recited in claim 11 wherein the protective overcoat comprises one or more layers selected from the group consisting of silicon oxynitride layers, silicon oxide layers, and silicon nitride layers, phospho-silicate glass layers, and organic polymer layers.

15. The method as recited in claim 11 wherein a thickness of the skirt tapers down as it moves away from the surface conductive lead.

\* \* \* \* \*